United States Patent
Brillhart et al.

(10) Patent No.: US 8,123,902 B2
(45) Date of Patent: Feb. 28, 2012

(54) GAS FLOW DIFFUSER

(75) Inventors: Paul Brillhart, Pleasanton, CA (US);
Daniel J. Hoffman, Saratoga, CA (US);
James D. Carducci, Sunnyvale, CA
(US); Xiaoping Zhou, San Jose, CA
(US); Matthew L. Miller, Fremont, CA
(US)

(73) Assignee: Applied Materials, Inc., Santa Clara, CA (US)

( * ) Notice: Subject to any disclaimer, the term of this patent is extended or adjusted under 35 U.S.C. 154(b) by 1130 days.

(21) Appl. No.: 11/689,031

(22) Filed: Mar. 21, 2007

(65) Prior Publication Data
US 2008/0230518 A1 Sep. 25, 2008

(51) Int. Cl.
*C23C 16/00* (2006.01)
*H01L 21/306* (2006.01)
(52) U.S. Cl. ............... 156/345.33; 156/345.34; 118/715
(58) Field of Classification Search .................. 118/715, 118/723 I, 723 IR, 723 AN; 156/345.33, 156/345.34, 345.48, 345.49
See application file for complete search history.

(56) References Cited

U.S. PATENT DOCUMENTS

| | | | |
|---|---|---|---|
| 5,556,501 A | 9/1996 | Collins et al. | |
| 6,035,101 A | 3/2000 | Sajoto et al. | |
| 6,054,013 A | 4/2000 | Collins et al. | |
| 6,450,117 B1* | 9/2002 | Murugesh et al. | 118/723 ME |
| 6,499,425 B1* | 12/2002 | Sandhu et al. | 118/723 E |
| 6,828,246 B2* | 12/2004 | Tu et al. | 438/710 |
| 2002/0021545 A1 | 2/2002 | Tatsumi et al. | |
| 2002/0134507 A1* | 9/2002 | DeDontney et al. | 156/345.33 |
| 2004/0099216 A1* | 5/2004 | Koh et al. | 118/723 CB |
| 2005/0251990 A1 | 11/2005 | Choi et al. | |
| 2006/0046496 A1 | 3/2006 | Mui et al. | |
| 2006/0162661 A1* | 7/2006 | Jung et al. | 118/723 ER |
| 2006/0196604 A1 | 9/2006 | Moriya et al. | |
| 2006/0228490 A1 | 10/2006 | Wang et al. | |
| 2007/0042603 A1 | 2/2007 | Kropewnicki et al. | |

FOREIGN PATENT DOCUMENTS

JP 11-323563 * 11/1999

OTHER PUBLICATIONS

The First Office Action issued Aug. 21, 2009 in Chinese Patent Application No. 200810084518.2.

* cited by examiner

*Primary Examiner* — Luz L. Alejandro
(74) *Attorney, Agent, or Firm* — Patterson & Sheridan, L.L.P.

(57) ABSTRACT

A method and apparatus for providing flow into a processing chamber are provided. In one embodiment, a vacuum processing chamber is provided that includes a chamber body having an interior volume, a substrate support disposed in the interior volume and a gas distribution assembly having an asymmetrical distribution of gas injection ports. In another embodiment, a method for vacuum processing a substrate is provided that includes disposing a substrate on a substrate support within in a processing chamber, flowing process gas into laterally into a space defined above a gas distribution plate positioned in the processing chamber over the substrate, and processing the substrate in the presence of the processing gas.

15 Claims, 7 Drawing Sheets

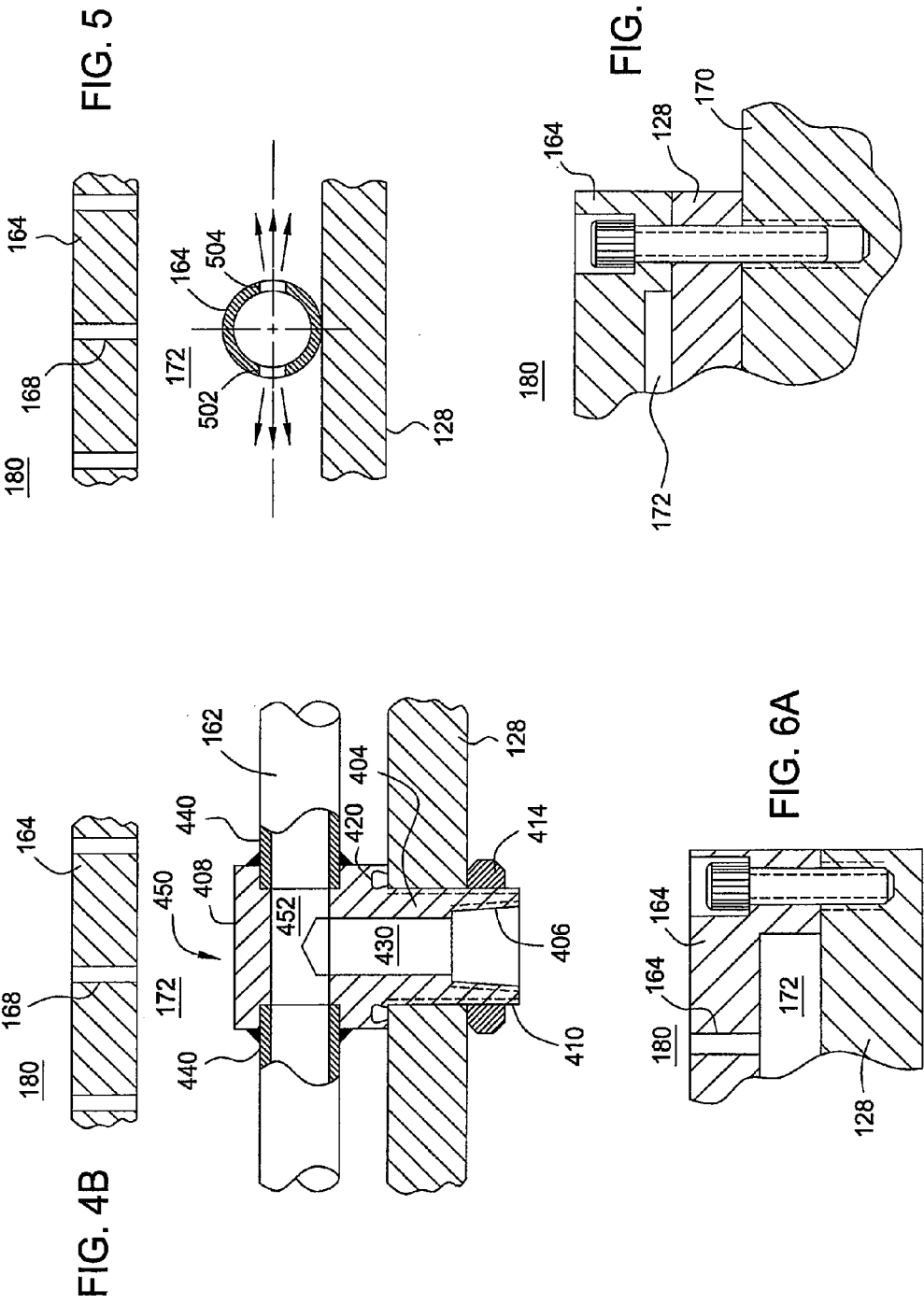

GAS FLOW DIFFUSER

BACKGROUND

1. Field of the Invention

Embodiments of the present invention relate to a semiconductor substrate processing system. More particularly, embodiments of the invention relate to a gas flow diffuser for controlling the flow of gases within a semiconductor substrate processing chamber.

2. Background of the Related Art

Integrated circuits have evolved into complex devices that can include millions of components (e.g., transistors, capacitors, resistors, and the like) on a single chip. The evolution of chip designs continually requires faster circuitry and greater circuit density. The demands for greater circuit density necessitate a reduction in the dimensions of the integrated circuit components. The minimal dimensions of features of such devices are commonly referred to in the art as critical dimensions. The critical dimensions generally include the minimal widths of the features, such as lines, columns, openings, spaces between the lines, and the like.

As these critical dimensions shrink, process uniformity across the substrate becomes paramount to maintain high yields. One problem associated with a conventional plasma etch process used in the manufacture of integrated circuits is the non-uniformity of the etch rate across the substrate, which may be due, in part, to a lateral offset between the reactive species and the substrate being etched. One factor contributing to the tendency of the reactive species to be offset from the center of the substrate is the radial location of the chamber exhaust port. As gases are more easily pumped from areas of the chamber that are closest to the exhaust port, the reactive species are pulled toward the exhaust port, thereby becoming offset with respect to the center of the chamber and the substrate positioned therein. This offset contributes to a loss of etch uniformity over the surface of the substrate which may significantly affect performance and increase the cost of fabricating integrated circuits.

A flow restricting device may be positioned within the chamber to change the chambers conductance in order to compensate for the offset of the pumping port. Although this technique has demonstrated good processing results, a level of process uniformity has not been achieved that will enable next generation devices, believed at least in part to be due to the inability to completely compensate for conductance non-uniformity above the substrate being processed within the processing chamber. Thus, as linewidths and critical dimensions continue to shrink, the need remains for a continued improvement in process uniformity in order to enable fabrication of next generation devices at a practical cost of manufacture.

Therefore, there is a need in the art for an improved apparatus for etching material layers during the manufacture of integrated circuits.

SUMMARY

A method and apparatus for providing flow into a processing chamber are provided. In one embodiment, a vacuum processing chamber is provided that includes a chamber body having an interior volume, a substrate support disposed in the interior volume and a pumping port disposed below a plane of a substrate supporting surface of the substrate support. The pumping port location and geometry of the interior volume have a configuration that produces an asymmetrical processing result on a substrate disposed on the substrate supporting surface of the substrate support. The processing chamber also includes a gas distribution assembly positioned above the plane of the substrate supporting surface of the substrate support, wherein a configuration of the gas distribution assembly is selected to tune the processing results so as to provide a symmetry of the processing results caused by the location of the pumping port and geometry of the interior volume.

In another embodiment, a vacuum processing chamber is provided that includes a chamber body having an interior volume, a substrate support disposed in the interior volume and a gas distribution assembly having an asymmetrical distribution of gas injection ports.

In yet another embodiment, a vacuum processing chamber is provided that includes a chamber body having sidewalls and a lid defining an interior volume, a substrate support disposed in the interior volume and a gas distribution assembly. The gas distribution assembly includes a gas distribution plate coupled to the lid and at least one ring positioned between the gas distribution plate and the lid, the ring having an asymmetrical distribution of gas injection ports.

In still yet another embodiment, a method for vacuum processing a substrate is provided that includes disposing a substrate on a substrate support within in a processing chamber, flowing process gas into laterally into a space defined above a gas distribution plate positioned in the processing chamber over the substrate, and processing the substrate in the presence of the processing gas.

In a further embodiment, a gas distribution assembly is provide that includes a gas distribution plate having a plurality of apertures formed through the plate, the apertures having an orientation substantially parallel to a centerline of the plate, and at least one ring coupled to the gas distribution plate, the ring having a plurality of gas injection ports having an orientation different than the orientation of the apertures of the plate.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIG. 4B is a sectional view of another embodiment of a coupling;

FIG. 5 is a sectional view of the gas diffuser taken along section line 5-5 of FIG. 2;

FIGS. 6A-B are sectional views of the gas diffuser taken along section lines 6A-6A and 6B-6B of FIG. 2;

It is to be noted, however, that the appended drawings illustrate only typical embodiments of this invention and are therefore not to be considered limiting of its scope, for the invention may admit to other equally effective embodiments. It is also contemplated that features of one embodiment may be beneficially utilized in other embodiments without further recitation.

DETAILED DESCRIPTION

Embodiments of the present invention generally relate to an apparatus for improving process uniformity across a semiconductor substrate in a plasma processing chamber. Those skilled in the art will understand that other forms of plasma etch chambers may be used to practice the invention, including reactive ion etch (RIE) chambers, electron cyclotron resonance (ECR) chambers, and the like. Furthermore, embodiments of the present invention may be useful in any processing chamber where flow control may improve process uniformity across the surface of a substrate during processing, such as atomic layer deposition (ALD) chambers, chemical vapor deposition (CVD) chambers, plasma enhanced chemical vapor deposition (PECVD) chambers, magnetically enhanced plasma processing chambers, and the like.

Figure 1:
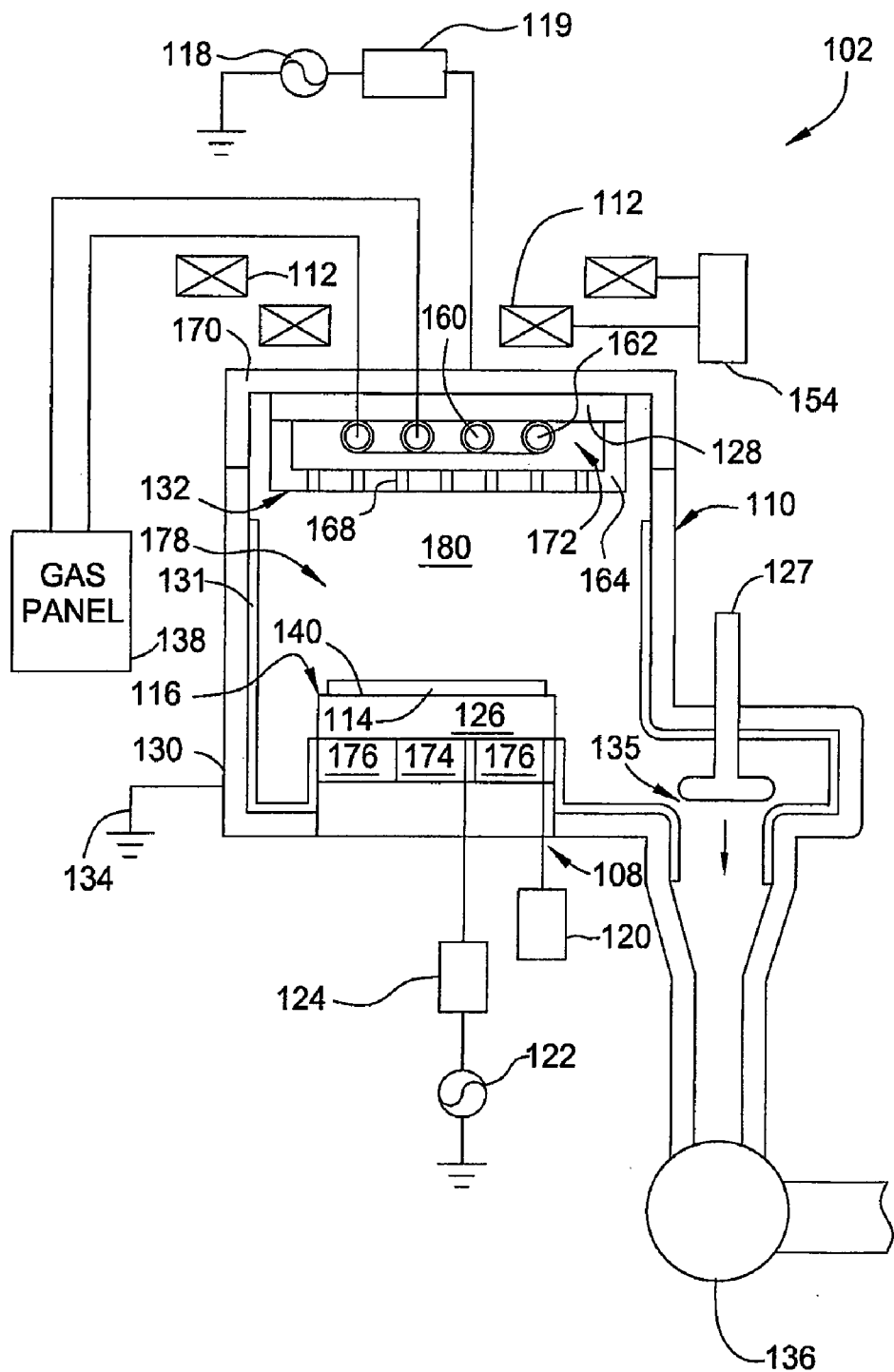
FIG. 1 is a schematic sectional view of an exemplary processing chamber having one embodiment of a gas diffuser of the present invention.

FIG. 1 depicts a schematic, cross-sectional diagram of vacuum processing chamber 102 having a gas diffuser 132 in accordance to an embodiment of the present invention. In the embodiment illustrated in FIG. 1, the gas diffuser 132 tunes process uniformity, enabling compensation for conductance or other chamber attributes that cause asymmetrical processing (e.g., processing results that are not symmetrically relative to a centerline of the substrate). In another embodiment, the gas diffuser 132 may be used to create an asymmetrical processing result. One example of a processing chamber in which the invention may be beneficially utilized is an ENABLER™ processing chamber available from Applied Materials, Inc., of Santa Clara, Calif. It is also contemplated that the invention may be used to advantage in other processing chambers, including those from other manufacturers.

In one embodiment, a processing chamber 102 comprises a vacuum chamber body 110 having a conductive chamber wall 130 and bottom 108. The chamber wall 130 is connected to an electrical ground 134. A lid 170 is disposed on the chamber wall 130 to enclose an interior volume 178 defined within the chamber body 110. At least one solenoid segment 112 is positioned exterior to the chamber wall 130. The solenoid segment(s) 112 may be selectively energized by a DC power source 154 that is capable of producing at least 5V to provide a control knob for plasma processes formed within the processing chamber 102.

A ceramic liner 131 is disposed within the interior volume 178 to facilitate cleaning of the chamber 102. The byproducts and residue of the etch process may be readily removed from the liner 131 at selected intervals.

A substrate support pedestal 116 is disposed on the bottom 108 of the process chamber 102 below the gas diffuser 132. A process region 180 is defined within the interior volume 178 between the substrate support pedestal 116 and the diffuser 132. The substrate support pedestal 116 may include an electrostatic chuck 126 for retaining a substrate 114 on a surface 140 of the pedestal 116 beneath the gas diffuser 132 during processing. The electrostatic chuck 126 is controlled by a DC power supply 120.

The support pedestal 116 may be coupled to an RF bias source 122 through a matching network 124. The bias source 122 is generally capable of producing an RF signal having a tunable frequency of 50 kHz to 13.56 MHz and a power of between 0 and 5000 Watts. Optionally, the bias source 122 may be a DC or pulsed DC source.

The support pedestal 116 may also include inner and outer temperature regulating zones 174, 176. Each 174, 176 may include at least one temperature regulating device, such as a resistive heater or a conduit for circulating coolant, so that the radial temperature gradient of the substrate disposed on the pedestal may be controlled. An example of one suitable pedestal with inner and outer temperature regulating zones is described in U.S. patent application Ser. Nos. 10/960,874 and 11/531,474, which are incorporated by reference in their entireties.

The interior of the chamber 102 is a high vacuum vessel that is coupled to a vacuum pump 136 through an exhaust port 135 formed through the chamber wall 130 and/or chamber bottom 108. A throttle valve 127 disposed in the exhaust port 135 is used in conjunction with the vacuum pump 136 to control the pressure inside the processing chamber 102. The position of the exhaust port 135 and other flow restrictions within the interior volume 178 of the chamber body 110 greatly influence the conductance and gas flow distribution within the processing chamber 102.

The gas diffuser 132 provides a conduit through which at least one process gas is introduced into the processing region 180 in an asymmetrical manner that may be utilized to tune the conductance and gas flow distribution described above that are caused by the other chamber components (e.g., location of the exhaust port, geometry of the substrate support pedestal or other chamber component) so that the flow of gases and species are delivered to the substrate in a uniform, or selected, distribution. The gas diffuser 132 is used to control or tune various processing parameters in the chamber to provide symmetry of processing results. The gas diffuser 132 may alternatively be used to control or tune various processing parameters in the chamber to create asymmetry of processing results. Moreover, the gas diffuser 132 may be utilized to position the plasma relative to the centerline of the substrate 114 (which is concentrically disposed on the pedestal 116). Moreover, the configuration of the gas diffuser 132 may be selected to improve process uniformity, or alternatively, create a predefined offset in processing results. For example, the configuration of the gas diffuser 132 may be selected to direct the flow of gas entering the process region 180 above the substrate support pedestal 116 in a manner that compensates for the chamber conductance. This may be accomplished by configuring the gas diffuser 132 to deliver gas into the process chamber with an asymmetry that offsets the asymmetric effects of the chamber conductance on plasma location and/or the delivery of ions and/or reactive species to the surface of the substrate during processing.

In an embodiment such as the one depicted in FIG. 1, the gas diffuser 132 includes at least two gas distributors 160, 162, a mounting plate 128 and a gas distribution plate 164. The gas distributors 160, 162 are coupled to one or more gas panels 138 through the lid 170 of the processing chamber 102. The flow of gas through the gas distributors 160, 162 may be independently controlled. Although the gas distributors 160, 162 are shown coupled to a single gas panel 138, it is contemplated that the gas distributors 160, 162 may be coupled to one or more shared and/or separate gas sources. Gases provided from the gas panel 138 are delivered into a region 172 defined between the plates 128, 164, then exit through a plurality of holes 168 formed through the gas distribution plate 164 into the processing region 180.

The mounting plate 128 is coupled to the lid 170 opposite the support pedestal 116. The mounting plate 128 is fabricated from or covered by an RF conductive material. The mounting plate 128 is coupled to an RF source 118 through an impedance transformer 119 (e.g., a quarter wavelength matching stub). The source 118 is generally capable of producing an RF signal having a tunable frequency of about 162 MHz and a power between about 0 and 2000 Watts. The mounting plate 128 and/or gas distribution plate 164 is powered by the RF source 118 to maintain a plasma formed from the process gas present in the process region 180 of the processing chamber 102.

The gas distributors 160, 162 are coupled to at least one of the mounting or gas distribution plates 128, 164. In one embodiment, the gas distributor 160 may be positioned radially inward of the gas distributor 162. The gas distributors 160, 162 may be concentrically oriented relative to each other, both concentrically oriented relative to the centerline of the pedestal 116, both non-concentrically oriented relative to the centerline of the pedestal 116, one concentrically oriented and one non-concentrically oriented relative to the centerline of the pedestal 116, or other suitable configuration. In the embodiment depicted in FIG. 1, the gas distributors 160, 162 are, but not limited to, concentric rings.

The asymmetry of the gas flow exiting the diffuser 132 into the processing region 180 may be created by the non-concentricity of the gas distributors 160, 162 to each other and/or the centerline of the pedestal 116. The asymmetry of the gas flow exiting the diffuser 132 into the processing region 180 may also or alternatively be created by a radial non-uniformity of gases flowing out of at least one of the gas distributors 160, 162 as further discussed below.

Figure 2:
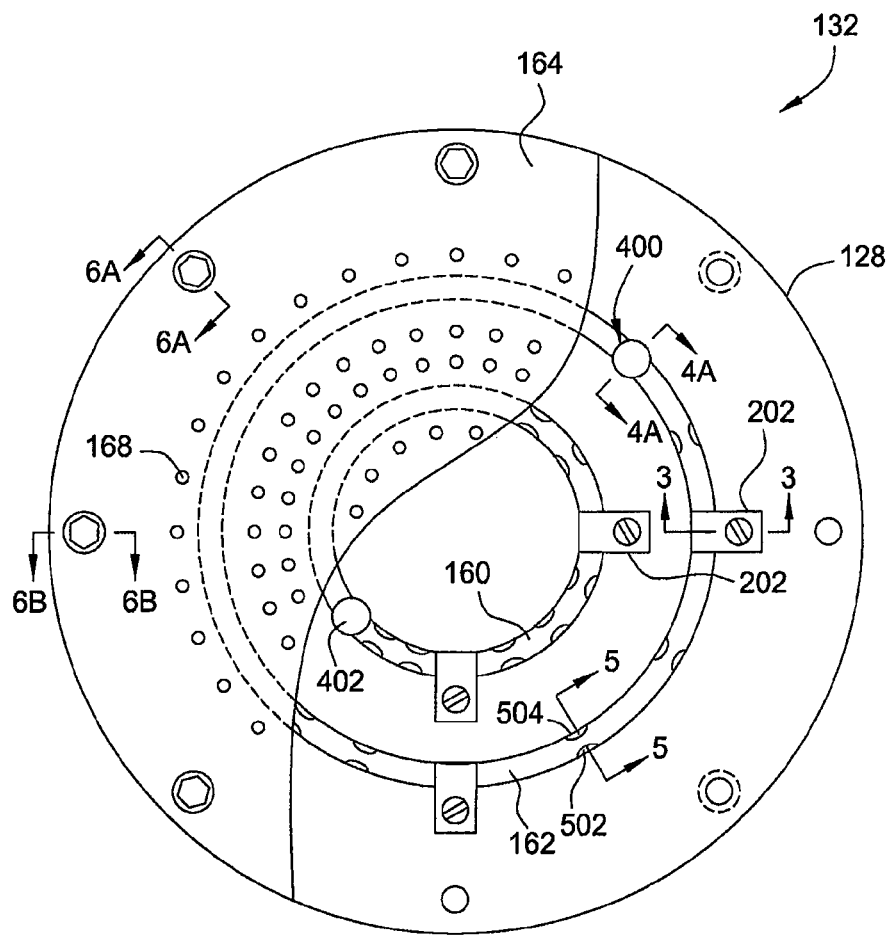
FIG. 2 is a bottom cut-away view of one embodiment of the gas diffuser of FIG. 1.
Figure 7A:
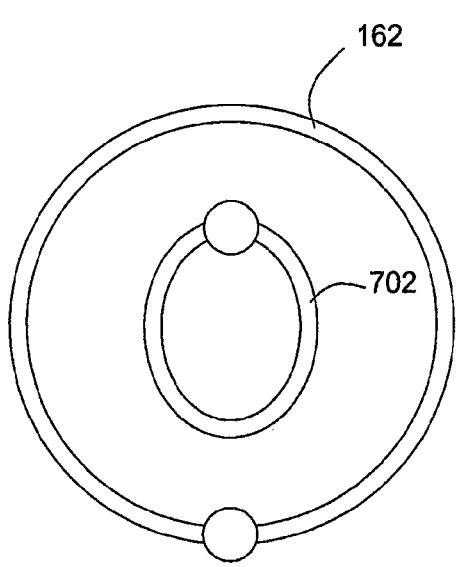
FIGS. 7A-B are schematic bottom views of alternative embodiments for exemplary of gas distributors.
Figure 7B:
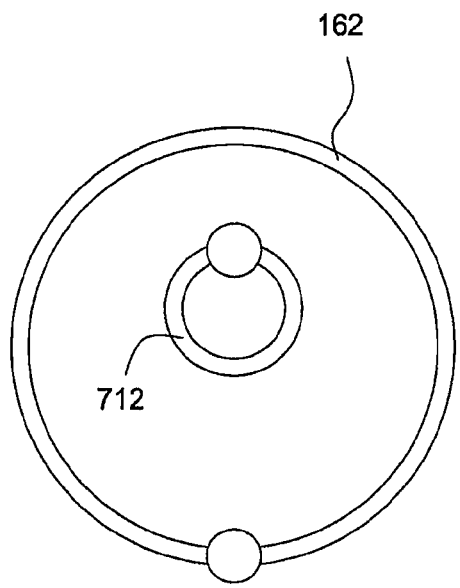

FIG. 2 depicts a bottom cut-away view of one embodiment of the gas diffuser 132 depicted in FIG. 1. The gas distribution plate 164 is cut-away to shown an exemplary concentric orientation of the gas distributors 160, 162. In the embodiment depicted in FIG. 2, the gas distributors 160, 162 are shown as concentric rings. The gas distributors 160, 162 may alternatively have a variety of other orientations, for example at least one gas distributor 702 may have an oval or ellipsoidal shape, as shown in FIG. 7A. In another example, at least one gas distributor 712 may be non-concentric with the outer gas distributor 162, as shown in FIG. 7B. Although the outer gas distributor is shown above as a circular ring, it may alternatively have any of the configurations described above, either with a circular inner gas distributor or with a non-circular inner gas distributor. It is also contemplated that none, one or all of the gas distributors may be concentrically oriented relative to the centerline the mounting plate 128. The mounting plate 128 is generally coaxially aligned with the centerline of the pedestal 116, and consequently, the substrate positioned thereon.

Returning to FIG. 2, the gas distributors 160, 162 may be secured to at least one of the plates 128, 164. In one embodiment, the gas distributors 160, 162 are secured to the mounting plate 128 by a plurality of brackets 202 or by other suitable manner. Alternatively, the gas distributors 160, 162 may be compressed between the plates 128, 164.

Figure 3:
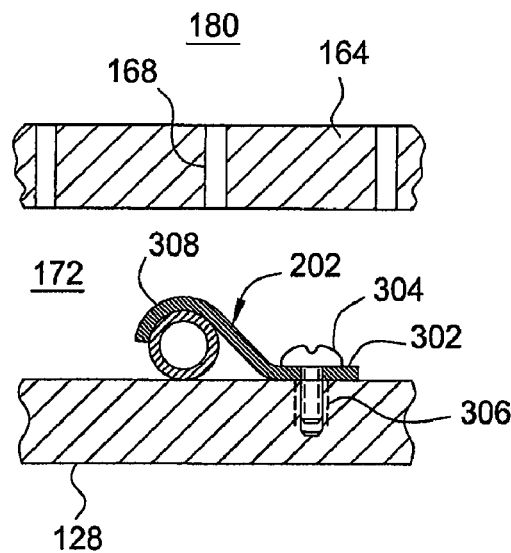
FIG. 3 is a partial sectional view of the gas diffuser of FIG. 1 taken along section ling 3-3 of FIG. 2.

FIG. 3 depicts a sectional view of one embodiment of the bracket 202 securing the outer gas distributor 162 to the mounting plate 132. The inner gas distributor 160 is similarly retained. The bracket 202 includes a tab 302 and a finger 308. A fastener 304 extends through a hole in the tab 302 and is engaged with a threaded hole 306 formed in the mounting plate 128. The finger 308 may be curved or otherwise formed to retain the gas distributor 162 proximate the plate 132 upon installation of the fastener 304. It is contemplated that the gas distributors may be held in position utilizing other techniques.

Figure 4A:
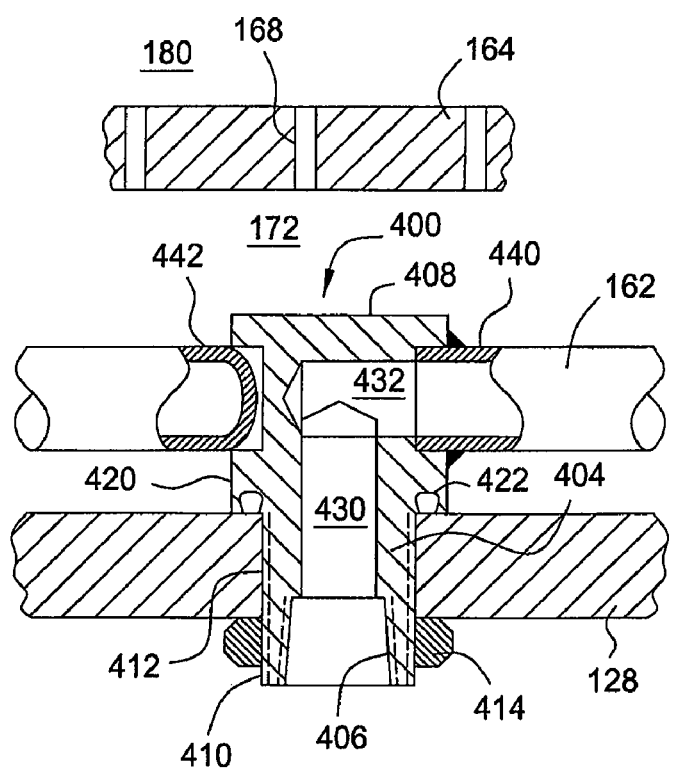
FIG. 4A is a partial sectional view of the gas diffuser of FIG. 1 illustrating one embodiment of a coupling taken along section line 4A-4A of FIG. 2.

FIG. 4A depicts a sectional view of a coupling 400 of the outer gas distributor 162 utilized to connect the outer gas distributor 162 to the gas panel 138. The inner gas distributor 160 includes a similar coupling 402, as shown in FIG. 2. Although the couplings 400, 402 are shown offset 180 degrees in the embodiment depicted in FIG. 2, the orientation of the couplings 400, 402 may be arranged in any convenient manner.

Returning primarily to FIG. 4A, the coupling 400 includes a body 408 and a stem 404. The stem 404 extends through a hole 412 formed in the mounting plate 128. In one embodiment, the stem 404 includes a male threaded portion 410 which enables a panel nut 414 or other fastener to secure the coupling 400 to the mounting plate 128. The stem 404 also includes a threaded port 406 which enables connection of the coupling 400 to a gas delivery line (not shown) routed from the gas panel 138. It is contemplated that the coupling may have other configurations suitable for easy attachment to the gas panel and/or mounting plate.

The body 408 includes a mounting flange 420. The mounting flange 420 has a o-ring gland 422 that accommodates a seal (not shown) which is compressed upon tightening of the panel nut 414 to prevent leakage through the hole 412.

The body 408 includes a passage 430 that couples the port 406 to a cross hole 432. The cross hole 432 has a counterbore that accepts an open end 440 of the gas distributor 162. The open end 440 of the gas distributor 162 may be sealed to body 408 by any suitable method, for example, by adhesive, brazing, welding, pressfit, swaging or by a suitable gas-tight fitting. A second counterbore accepts a closed end 442 of the gas distributor 162 such that gases flowing into the coupling 400 through the port 406 the open end 440 of the gas distributor 162 and flow to the closed end 442. The gases exit the gas distributor 162 through a plurality of asymmetrically distributed ports, as discussed further below with reference to FIG. 5.

FIG. 4B depicts a sectional view of an alternative embodiment of a coupling 450. The coupling 450 is substantially similar to the coupling 400 described above, except for a crosshole 452 that extends through the body 408 to allow two open ends 440 of the gas distributor 462 to receive gas flowing through the passage 430 from the port 406.

FIG. 5 is a sectional view of the gas distributor 162 taken along section line 5-5 of FIG. 2. The gas distributor 162 may be similarly configured. The gas distributor 162 includes a plurality of holes that allow gases into the region 172. In one embodiment, inner and outer gas injection ports 502, 504 are formed through the gas distributor 162. The gas injection ports 502, 504 may have any angular orientation in both the vertical and horizontal planes selected to produce a desired flow and/or pressure distribution within the gas diffuser 132. In the embodiment depicted in FIG. 5, the inner and outer gas injection ports 502, 504 are arranged concentrically, and have a centerline parallel to the plane of the gas distribution plate 164.

The diameters of the gas injection ports 502, 504 may be different or equal. For example, the diameter of the radially inner facing gas injection port 504 may be larger than the diameter of the radially outer facing gas injection port 502 to provide more gas to the inner regions of the gas diffuser 132. Alternatively, the diameter of the radially outer facing gas injection port 502 may be larger than the diameter of the radially inner facing gas injection port 504 to provide more gas to the outer regions of the gas diffuser 132.

Additionally, the density and/or distribution of the radially inner facing holes 502 along the gas distributor 162 may vary. For example, the number of the radially inner facing holes 504 may be greater per unit length of the distributor 162 in one region relative to another. In the embodiment depicted in FIG. 2, the number and/or open area of radially inner facing holes 504 increases per unit length along the gas distributor 162 further from the coupling 400 as measured from the open end 440. This arrangement may be utilized to allow more gas to be delivered near the coupling 400 (or other selected region), or to compensate for pressure drop along the length of the distributor so holes 504 near the closed end 442 receive a greater amount of gas as compared to a distributor with a symmetrical distribution of holes.

It is contemplated that the density, open area and/or distribution of the radially outer facing holes 504 may be the same as, or different from, that of the radially inner facing holes 502. It is also contemplated that the relative diameters of individual gas injection ports 502, 504 may be selected to deliver more gas near the coupling 400 (or other selected region), or to compensate for pressure drop along the length of the distributor so gas injection ports 502, 504 near the closed end (or other selected region) receive a greater amount of gas as compared to a distributor with a symmetrical distribution of holes.

The configuration of the inner gas distributor 160 may be similar to, or different from, the configuration of the outer gas distributor 162. In the embodiment depicted in FIG. 2, the inner and outer gas distributors 160, 162 are configured with increasing hole density and/or open area per unit length as measured from the open end of the distributors. Additionally in the embodiment depicted in FIG. 2, the location of the couplings 400, 402 of the distributors 160, 162 are arranged 180 degrees out of phase, along with the direction in that the distributor extends from the coupling toward the closed end. In an alternative embodiment, the inner and outer gas distributors 160, 162 are configured with substantially uniform hole density between the open and closed ends, but have decreasing hole diameters from the open to closed end of the distributors 160, 162. It is also contemplated that the gas distributors 160, 162 may be arranged in any combination of the above.

FIGS. 6A-B depicts sectional views of the how the places 128, 164 of the diffuser 132 are coupled together and how the diffuser 132 is coupled to the lid assembly 170. As depicted in the sectional view of FIG. 6A, a fastener 602 is passed through a clearance hole in the distribution plate 164 and engaged with a threaded hole in the mounting plate 132. As depicted in the sectional view of FIG. 6B, a fastener 612 is passed through a clearance holes formed through the distribution and mounting plates 164, 132 and engaged with a threaded hole in the lid assembly 170. This mounting arrangement allows for the diffuser 132 to be readily removed from the lid assembly 170, thereby facilitating exchange for a diffuser having a different flow configuration. Additionally, the plates 164, 132 may be easily separated to allow one or more of the gas distributors 160, 162 to be exchanged by removing and/or loosening the bracket 202, thereby allowing quick reconfiguration of the diffuser 132 and adaptation for other process control attributes.

Figure 8:
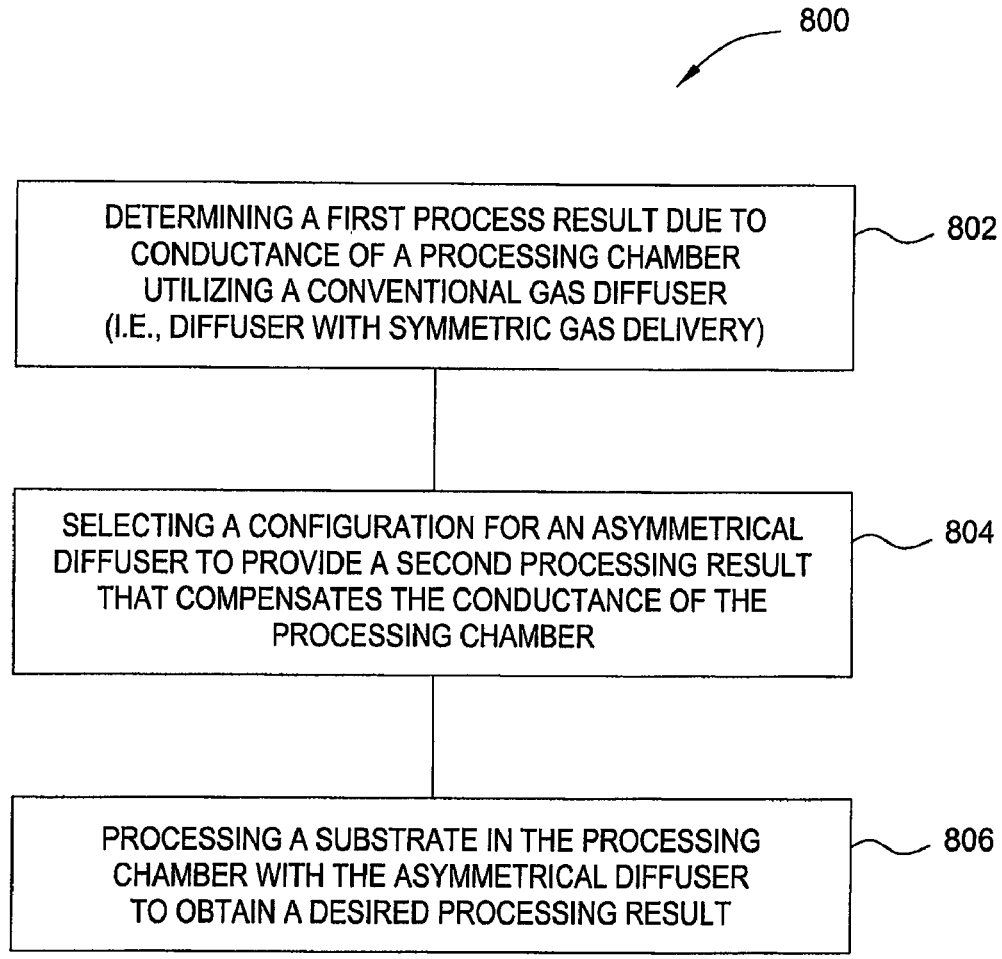
FIG. 8 is a flow diagram of one embodiment of a method for tuning a semiconductor fabrication process.
Figure 9A:
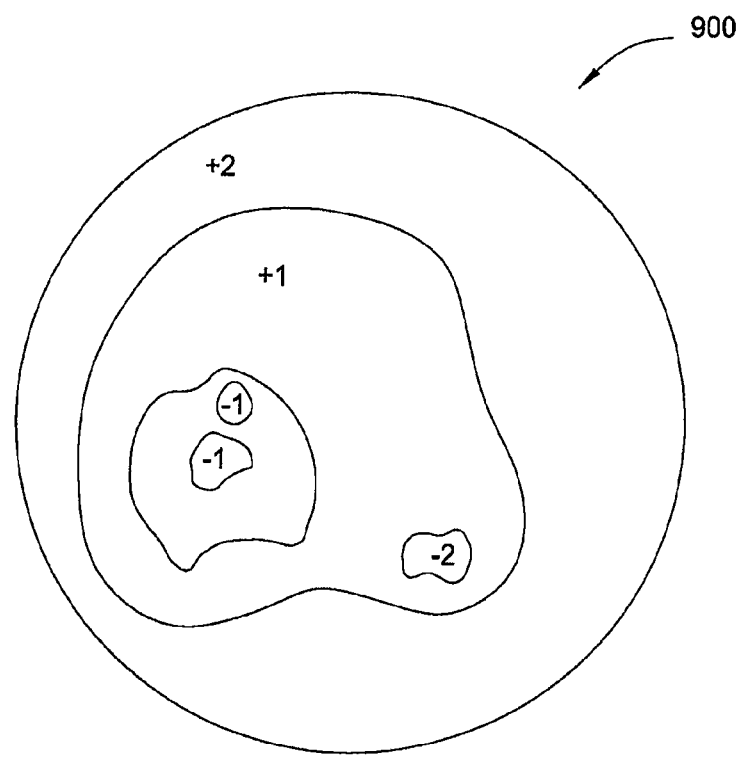
FIGS. 9A-B are schematic depictions of processing results obtained with symmetrical and asymmetrical diffusers.
Figure 9B:
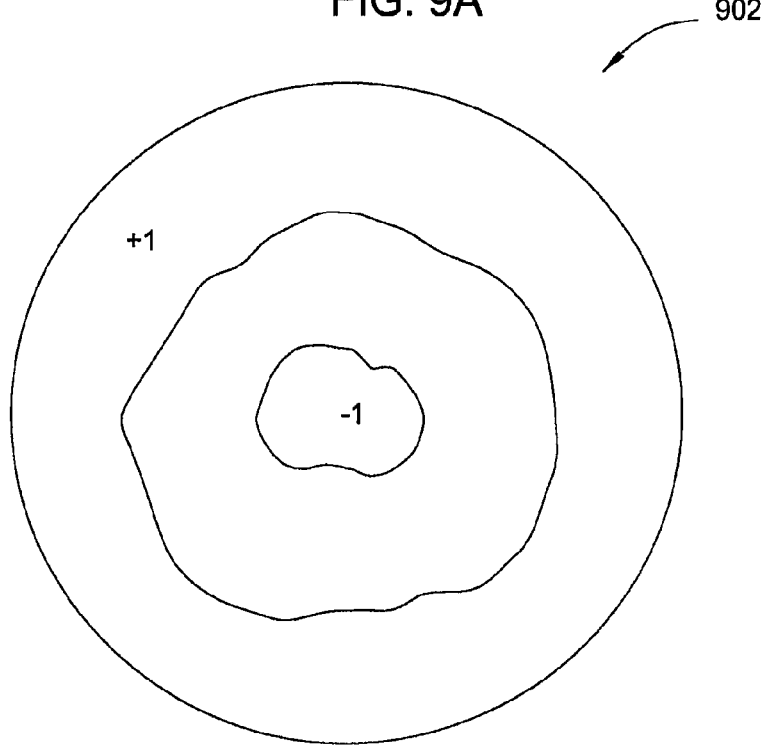

FIG. 8 is a block diagram of one embodiment of an exemplary method 800 for selecting a configuration for the gas distributors 160, 162. The method 800 begins at box 802 by determining a process result due to chamber conductance utilizing a conventional gas diffuser (e.g., a diffuser with symmetric gas delivery). Process results 900 for an etch process obtained at box 802 are depicted in FIG. 9A, which illustrates both lateral and azimuthal non-uniformity. At box 804, a configuration for the diffuser 132 is selected to an asymmetrical processing result, assuming the process was run in a chamber having a substantially uniform conductance. The configuration for the diffuser 132 selected at box 804 compensates for the non-uniformity of box 802, such that a desired processing result are obtained at box 806. Process results 902 obtained at box 806 are depicted in FIG. 9B, which illustrates substantial improvement for both the lateral and azimuthal etch results. The configuration of the diffuser 132 may be selected to center the processing results, as shown in FIG. 9B, or to minimize non-uniformity and control the lateral offset of processing results.

This process is particularly useful when changing process recipes. If one or more of flow rates, spacing, RF power, electrical or magnetic fields, substrate pedestal temperature gradients or other process parameter is changed which results in a shift in the conductance or plasma position within the chamber, the shift may be adjusted to provide a desired processing result by changing the configuration of the diffuser 132. This may be accomplished by replacing the diffuser or one or more of the gas distributors within the diffuser. As such, timely and cost effective process tuning may be realized.

While the foregoing is directed to some embodiments of the present invention, other and further embodiments of the invention may be devised without departing from the basic scope thereof, and the scope thereof is determined by the claims that follow.

What is claimed is:

1. A vacuum processing chamber, comprising:
   a chamber body having an interior volume;
   a substrate support disposed in the interior volume;
   a pumping port disposed below a plane of a substrate supporting surface of the substrate support, wherein a location of the pumping port and geometry of the interior volume have a configuration that produces an asymmetrical processing result on a substrate disposed on the substrate supporting surface of the substrate support; and
   a gas distribution assembly positioned above the plane of the substrate supporting surface of the substrate support, the gas distribution assembly comprising a gas distribution plate and at least one gas injection ring having an asymmetric distribution of gas injection ports operable to create an asymmetric distribution of gases between the gas injection ring and the gas distribution plate, wherein a configuration of the gas injection ring is selected to tune a symmetry for the processing result caused by the location of the pumping port and geometry of the interior volume.

2. The vacuum processing chamber of claim 1, wherein the configuration of the gas distribution assembly is selected to make the processing result caused by the location of the pumping port and geometry of the interior volume substantially symmetrical.

3. The vacuum processing chamber of claim 1 further comprising:
   at least one coil positioned outside the chamber body which may be energized to laterally tune a distribution of the process result.

4. The vacuum processing chamber of claim 1, wherein the gas distribution assembly further comprises:
   inner and outer gas injection rings independently controllable to alter a lateral distribution of the process result.

5. The gas distribution assembly of claim 1, wherein the gas injection ring comprises a plurality of gas injection ports radially arranged on the gas injection ring.

6. A vacuum processing chamber, comprising:
   a chamber body having an interior volume;

a substrate support disposed in the interior volume;
at least two gas injection rings that are non-concentric or having a different shape, at least one gas injection ring having an asymmetrical distribution of gas injection ports; and
a gas distribution plate disposed between the substrate support and the gas injection rings.

7. The vacuum processing chamber of claim 6, wherein the distribution of the gas injection ports is selected to produce a substantially asymmetrical processing result.

8. The vacuum processing chamber of claim 6, wherein the distribution of the gas injection ports is selected to produce a substantially symmetrical processing result from an asymmetrical result produced by a flow conductance of the chamber body.

9. The gas distribution assembly of claim 6, wherein each of the at least two gas injection rings comprises a plurality of gas injection ports formed through an inner surface and an outer surface of each of the gas injection rings.

10. A vacuum processing chamber, comprising:
a chamber body having sidewalls and a lid defining an interior volume;
a substrate support disposed in the interior volume; and
a gas distribution assembly comprising:
a gas distribution plate coupled to the lid; and
at least one ring positioned between the gas distribution plate and the lid, the ring having an asymmetrical distribution of gas injection ports operable to create an asymmetric distribution of gases between the ring and the gas distribution plate.

11. The vacuum processing system of claim 10, wherein the ports of the ring further comprise an orientation different than an orientation of gas flow apertures formed through the gas distribution plate.

12. The vacuum processing system of claim 10, wherein the gas distribution assembly further comprises an inner ring and an outer ring, the rings each having gas injection ports.

13. The vacuum processing system of claim 10, wherein the ports of the ring are substantially perpendicular to apertures formed through the gas distribution plate.

14. A gas distribution assembly, comprising:
a gas distribution plate having a plurality of apertures formed through the plate, the apertures having an orientation substantially parallel to a centerline of the plate; and
at least one ring coupled to the gas distribution plate, the ring having a plurality of gas injection ports having an orientation different than the orientation of the apertures of the plate wherein the gas injection ports of the at least one ring further have an asymmetrical distribution, operable to create an asymmetric distribution of gases between the ring and the gas distribution plate.

15. The gas distribution assembly of claim 14, wherein the at least one ring further comprises:
an inner ring and an outer ring.

* * * * *